United States Patent

Friend

[15] 3,681,738

[45] Aug. 1, 1972

[54] CIRCUIT BOARD SOCKET

[72] Inventor: Lindsay C. Friend, Camp Hill, Pa.

[73] Assignee: Berg Electronics, Inc., New Cumberland, Pa.

[22] Filed: Feb. 2, 1971

[21] Appl. No.: 111,909

[52] U.S. Cl. ..............339/17 R, 174/68.5, 339/95 D, 339/256 R, 339/275 B

[51] Int. Cl. .........H01r 9/12, H01r 11/00, H05k 1/02

[58] Field of Search .......339/17 R, 17 C, 17 D, 17 E, 339/176 MP, 275 R, 275 B, 252 R, 256 R, 258 R, 258 S, 259, 255, 64, 63, 59, 260, 262, 95

[56] References Cited

UNITED STATES PATENTS

| | | | |
|---|---|---|---|
| 3,156,517 | 11/1964 | Maximoff et al. | 339/17 R |
| 2,782,389 | 2/1957 | Sunko et al. | 339/17 D X |
| 2,922,978 | 1/1960 | Engel | 339/17 R |
| 3,114,586 | 12/1963 | Albert | 339/17 C |
| 2,638,573 | 5/1953 | Glickman et al. | 339/64 M |

*Primary Examiner*—Marvin A. Champion
*Assistant Examiner*—Terrell P. Lewis
*Attorney*—Thomas Hooker

[57] ABSTRACT

A miniature circuit board disconnect socket in which the inner legs of a M-shaped spring contact are confined within a socket body with the connecting bight portion therebetween adjacent the closed end of the body and the outer legs of the spring contact extending along the exterior of the socket body. The miniature socket is soldered to a circuit board to establish a direct electrical connection between circuitry on the board and the portion of the spring within the socket body. A solder resist may be applied to the spring adjacent the open end of the socket body to prevent molten solder from wicking into the socket during soldering.

28 Claims, 8 Drawing Figures

INVENTOR.
LINDSAY C. FRIEND
BY
Thomas Hooker,
His Attorney

INVENTOR.
LINDSAY C. FRIEND
BY
Thomas Hooker,
His Attorney

CIRCUIT BOARD SOCKET

The invention relates to miniature circuit board disconnect sockets of the type used on circuit boards to facilitate removably mounting electrical circuit components to the board and is an improvement of the circuit board socket disclosed in Olsson U.S. Pat. application Ser. No. 46,648 for "Circuit Board Socket" filed June 16, 1970, and assigned to the assignee of the present invention.

The disconnect socket includes a socket body with a disconnect spring confined therein for removably receiving a lead. Spring legs extend outwardly of the body and along the outside thereof so that they may be directly soldered to printed circuitry on the board. A solder resist may be applied to the spring adjacent the opening in the socket body to prevent solder from flowing into the interior of the body during the formation of the solder connection between the ends of the spring and the printed circuitry on the board. The disconnect socket may be used in a non-plated circuit board hole to form an interfacial connection between printed circuit pads on both sides of the circuit board. During soldering the exterior spring legs and socket body form a solder flow path so that the solder flows from one side of the board through the thickness of the board to the other side of the board where a solder connection is formed with the adjacent printed circuitry.

The spring used in the disconnect socket is generally M-shaped and includes two bowed interior legs which are confined within the closed socket body to form a spring contact for receiving a lead inserted within the body. The interior legs are connected to the exterior legs by means of spring curl or bight portions so that the exterior legs extend along the outer surface of the socket body. The connecting curls or bights are spaced from the lip at the open end of the body and may be provided with a chromium solder resist to prevent wicking of solder into the interior of the body. The exterior spring legs are bowed away from the body so that they form springs for confining the disconnect socket within the circuit board holes prior to soldering. The ends of the exterior legs joining the curl engage the exterior surface of the socket so that flexing of the outer legs during insertion into a circuit board hole does not affect the spring properties of the disconnect contact formed by the legs within the socket. In this way the disconnect socket may be used in circuit board holes of different diameter without affecting properties of the disconnect.

Other objects and features of the invention will become apparent as the description proceeds, especially when taken in conjunction with the accompanying drawings illustrating the invention, of which there are two sheets.

Figure 1:
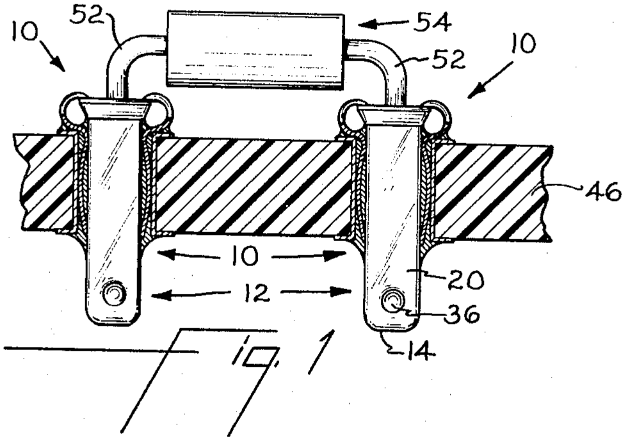
FIG. 1 is a sectional view taken through the thickness of a circuit board illustrating the use of a pair of circuit board sockets according to the invention.

Circuit board socket 10 comprises an elongate hollow metal body 12 having a closed end 14 and an open end 16. End 16 is flared outwardly to form a lip 18 which facilitates positioning a lead within the socket. The metal socket body is preferably formed by a drawing process so that it is seamless. By providing a seamless socket body molten solder is prevented from flowing into the interior of the socket during solder dipping.

The socket body 12 is generally square in cross section and includes four flat side walls 20. The corners 22 of the closed end 14 of the socket body are rounded to facilitate insertion of the socket 10 into a circuit board hole. A high yield strength spring contact 24 is confined in socket body 12. The spring 24 may be formed from generally flat spring stock material such as beryllium copper, and as indicated in FIG. 5 includes a pair of like interior legs 26 joined together by a bight portion 28 and a pair of like exterior legs 30 each of which is joined to an end of a leg 26 by a bight or curl portion 32.

Figures 5, 6, 7, 8:
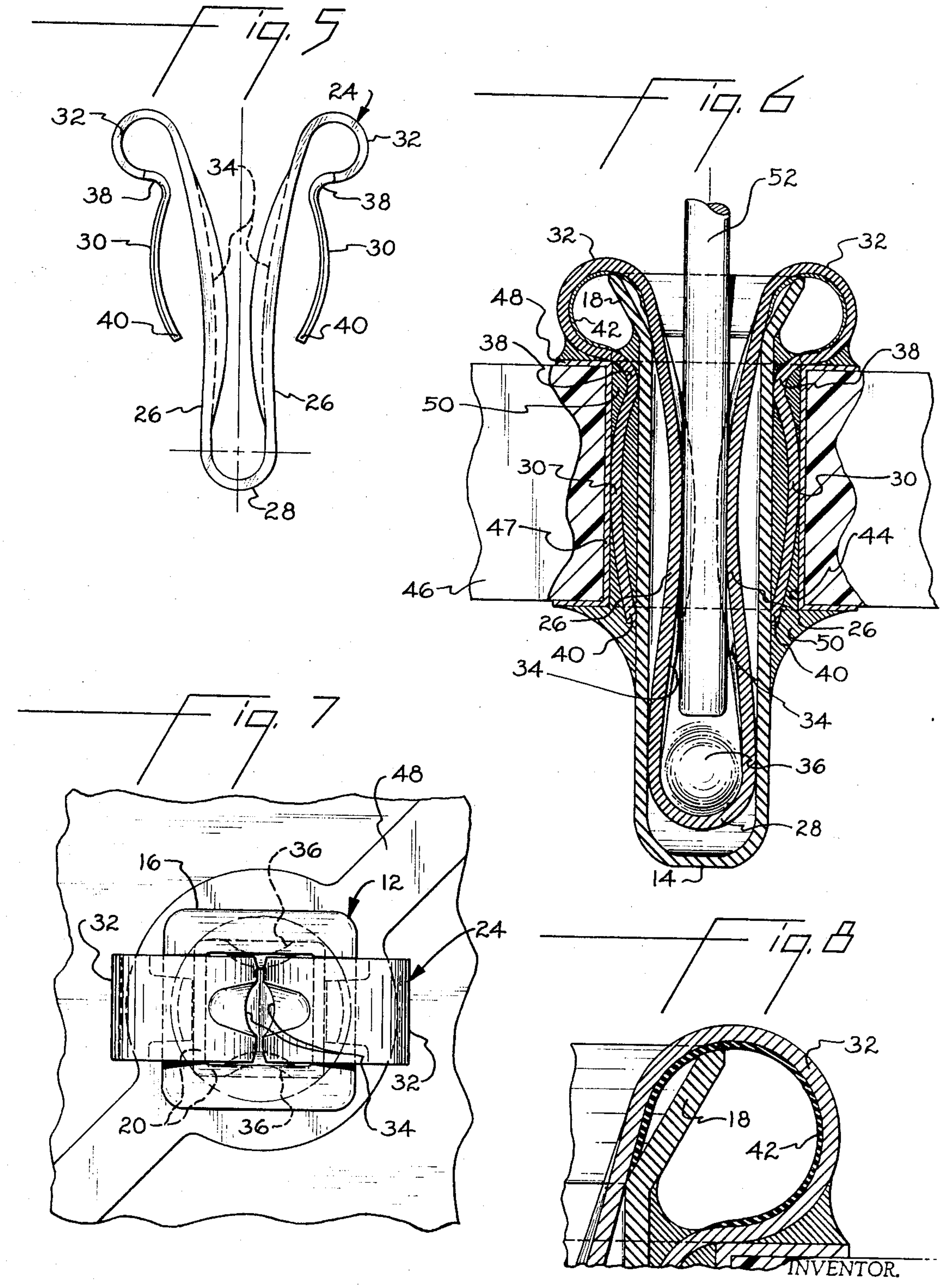
FIG. 6 is an enlarged sectional view illustrating one of the circuit board sockets of FIG. 1.
FIG. 7 is a top view illustrating a circuit board socket mounted in a circuit board.
FIG. 8 is a sectional view taken through one edge of the socket illustrating the use of a solder resist.

As shown in FIG. 5, the spring 24 is generally M-shaped. Each leg 30, bight 32 and adjacent interior leg 26 constitutes a U-shaped portion of the part of the spring. The two interior legs 26 with the connecting bight portion 28 also constitute a U-shaped portion of the spring. As indicated in FIG. 7, a contact groove 34 is formed in the opposing faces of contact legs 26 to facilitate electrical connection with a lead inserted into the socket, as shown in FIG. 6.

The spring 24 is positioned within the socket by moving bight 28 and legs 26 through opening 16 until the bight or curl portions 32 engage the edge of lip 18. With the spring so positioned a pair of locking dimples 36 are formed in the side walls 20 of the socket body adjacent the edges of legs 26 so that on the inside of the socket the dimples extend into bight portion 28 and lock the spring within the socket body 12. While the dimples prevent withdrawal of the spring the bight 28 is free to move toward closed end 14 of the socket body in response to elongation of legs 26 when a lead is inserted into the socket.

Figure 2:
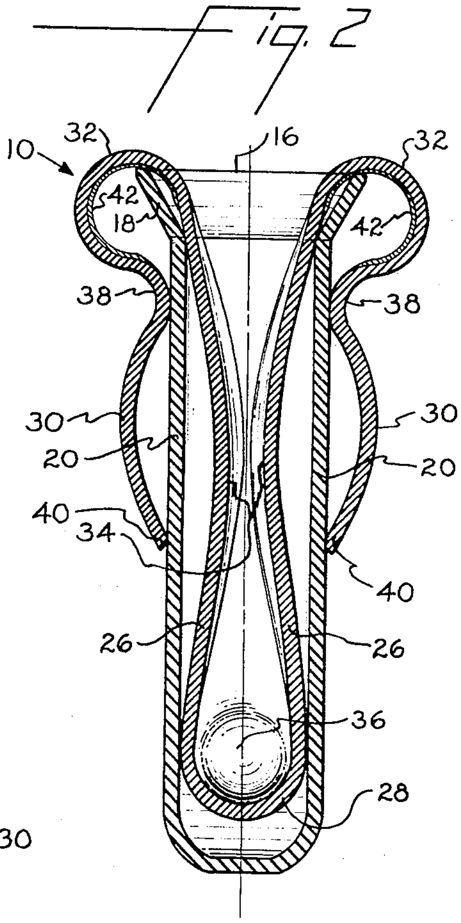
FIGS. 2 and 3 are sectional views taken through a circuit board socket.
Figure 3:
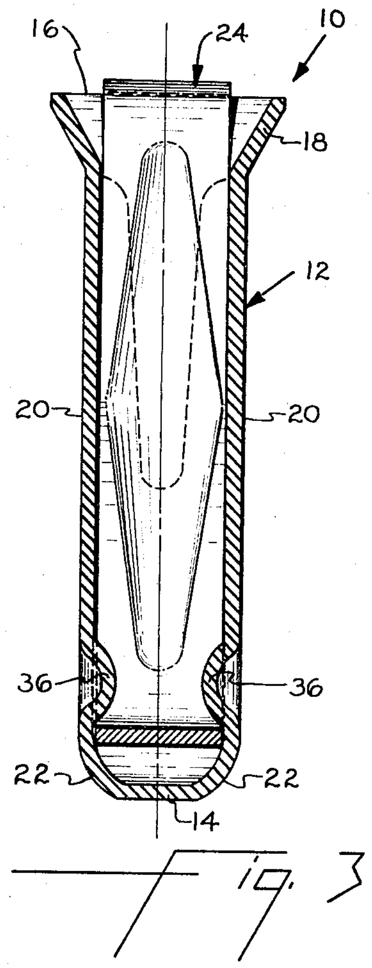
Figure 4:
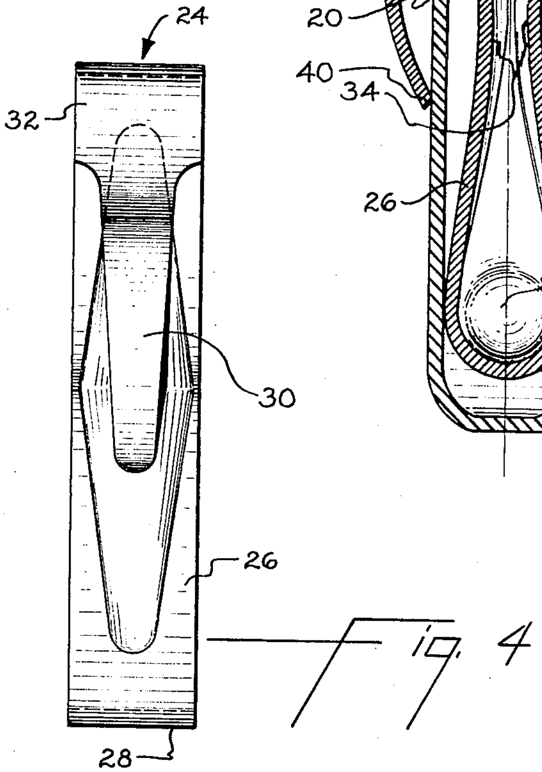
FIGS. 4 and 5 are side views of a contact spring used in the circuit board socket.

When the spring 24 has been inserted into the metal body 12 the curl or bight portions 32 extend away from the open end 16 of the body 12 and then are curved back toward the exterior of the socket body to join legs 30 at reverse bend 38. The legs 30 are bowed outwardly of the socket body and the bend 38 and free ends 40 of the legs engage the exterior of the socket body 12. As indicated in FIG. 2, interior legs 26 are bowed away from the adjacent body walls 20.

A suitable solder resist 42 is applied to the interior surfaces of curls 32 as illustrated in FIG. 8. The solder resist 42 may comprise a layer of plated chromium, a layer of another metal or metal compound to which solder does not adhere, or other suitable solder resist including well known organic solder resists.

The circuit board socket may be mounted in a hole 44 formed through the thickness of a circuit board 46 as shown in FIG. 6. Hole 44 may be plated with a conductive metal layer 47. The closed end 14 of the socket is first positioned in the hole and then the socket is moved through the hole so that during insertion the ends 40 of legs 30 are freely moved into the hole. With further insertion of the socket the legs 30 engage the sides of the hole and are bent toward the body 12. When the socket is fully inserted in the position of FIG. 6, the plating 48 at the top of the circuit board 46 engages curls 32. The legs 30 resiliently engage the plating 47 on the interior of the hole and hold the socket on the circuit board. Both ends of connecting bends 38 between curls 32 and legs 30 rest upon the sides of socket body 12 so that during insertion of the socket into the circuit board hole the deflection of legs 30 does not affect the spring properties of the disconnect portion of the spring confined within the body. Thus, disconnect socket 10 may be mounted in circuit board holes having a range of diameters without changing the spring characteristics of the disconnect portion within the socket. This feature is important since in mass production of circuit boards, the circuit board hole diameters vary considerably.

After the circuit board socket 10 has been mounted on circuit board 46, the board is then soldered so that the closed end of the disconnect socket and the adjacent side of the board is exposed to a molten solder bath. Solder 50 adheres to the exterior of the socket, the plated circuit board hole and legs 30 so that it flows by capilliary action from the bottom of the circuit board up through the openings between the socket body and the circuit board hole to the top of the board, as shown in FIG. 6. Upon cooling of the molten solder, a reliable solder connection is formed between the circuit board plating 48 and the spring legs 30. Because the interior of the curls 32 carry solder resist 42, the molten solder is prevented from flowing up between curls 32 and the lip 18 and into the interior of the body 12.

After soldering leads 52 of circuit component 54 may be inserted into appropriate disconnect sockets on board 46. The leads are first positioned in contact grooves 34 and with further insertion force apart legs 26 to form a redundant high pressure electrical connection with the spring. During insertion the leads 26 are bent apart and elongated somewhat so that the bight portion 28 is moved toward the closed end 14 of the socket body. Because the spring legs on the outside of the socket are in solder connection with the printed circuitry 48 on board 46, a reliable electrical connection is formed between leads 52 and the circuit board. In some instances it may be desirable to improve the contact properties of the socket 10 by plating the spring 32 with a highly conductive metal, such as gold.

While the circuit board hole 44 shown in the drawings is plated, the circuit board socket 10 may be used in non-plated circuit board holes where printed circuitry is provided at one or both ends of the hole. During soldering of the socket the bottom of the circuit board is exposed to molten solder and the solder flows along the solder flow path formed by each spring leg and the socket body up through the thickness of the circuit board to the top of the board thus forming a solder connection with printed circuitry on either side of the board. Because the body and exterior spring legs are confined within the circuit board hole, an electrical connection is formed between the socket and each adjacent printed circuit pad and an interfacial connection is formed between printed circuit pads on both sides of the circuit board. Thus, it is not necessary to plate the interior of the circuit board holes in which the socket is mounted where an interfacial connection is required.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A circuit board socket of the type having an elongate socket body closed at one end and open at the other end with a spring contact confined within the socket body for making an electrical connection with a male element inserted into the body, the improvement comprising a part of the spring contact extending from the interior of the socket body, around the edge of the opening at one end of the socket body and along the exterior of the socket body for forming an electrical connection between printed circuitry adjacent the body and the spring contact within the socket.

2. A circuit board socket as in claim 1 including a solder resist on said spring contact adjacent the said edge.

3. A circuit board socket as in claim 1 including a layer of chromium on the surface of the spring contact immediately adjacent the said edge for preventing solder wicking into the interior of the socket.

4. A circuit board socket as in claim 1 wherein said part of the spring contact adjacent the exterior of the socket includes spring means for confining the socket within a circuit board hole.

5. A circuit board socket as in claim 1 wherein the spring contact is provided with two like portions each of which extends from the interior of the socket body around said edge and along the exterior of the socket body, said portions being diametrically spaced on opposite sides of the socket and each including spring means on the outside of the socket for confining the socket within a circuit board hole prior to soldering.

6. A circuit board socket as in claim 5 including a solder resist applied to each of said portions adjacent said edge for preventing solder wicking into the socket.

7. A circuit board socket as in claim 6 wherein said solder resist comprises a metal layer on the surface of the parts to which solder does not adhere.

8. A circuit board socket as in claim 6 wherein said solder resist comprises a layer of chromium.

9. A circuit board socket as in claim 5 wherein said spring contact includes a bight connection joining said portions and wherein a dimple is formed in a side wall of the socket body between the bight connection and the open end of the socket body and extends into the interior of the socket body behind the bight connection to confine the spring contact within the socket body.

10. A circuit board socket as in claim 5 including means in the socket body for confining the spring contact within said body.

11. A circuit board socket comprising an elongate hollow body closed at one end and open at the other end, a generally M-shaped spring contact secured to the body with the center bight portion located within the body adjacent the closed end thereof, the inner legs extending along the interior side walls of the socket body toward the open end thereof, and outer bight portions extending around the lip at the open end of the socket body and the outer legs extending along the outside of the socket body away from the open end thereof, said center bight portion and inner legs comprising a contact for removably receiving a lead inserted into the socket and said outer legs comprising contacts for establishing an electrical connection with a circuit element.

12. A circuit board socket as in claim 11 wherein each of said inner legs is bowed away from the adjacent interior socket body wall and each of said outer legs is bowed away from the adjacent exterior socket body wall.

13. A circuit board socket as in claim 12 wherein the connection between each of said outer bight portions and said outer legs is located immediately adjacent the socket body so that the deformation of said outer legs does not alter the spring characteristics of the contact.

14. A circuit board socket as in claim 11 wherein said outer bight portions include solder resist to prevent solder from wicking into the interior of the body.

15. A circuit board socket as in claim 11 wherein said outer legs are bowed away from the exterior of the socket body and said outer bight portions comprise curls extending from the edge at the open end of the socket body away from the socket body and then back toward the socket body to a junction with said outer legs located immediately adjacent the socket body.

16. A circuit board socket as in claim 15 wherein the interior surfaces of said curls are covered by a solder resist.

17. A circuit board socket as in claim 16 wherein said solder resist comprises a layer of metallic material to which solder is non-adherent.

18. A circuit board socket as in claim 17 wherein said solder resist comprises a layer of chromium.

19. A disconnect socket for mounting in a circuit board hole and forming a solder connection with printed circuitry on the board comprising an elongate socket body closed at one end and open at the other end, a generally M-shaped spring contact secured to the socket body with the interior legs and connecting body portion thereof positioned within the socket body and the outer legs extending along the exterior walls of the socket body and the bight portions connecting said inner and outer legs extending around the socket lip at the open end thereof, each of said legs bowing away from adjacent walls of the socket body so that the inner legs form a spring contact for removably receiving a male element inserted into the socket and the outer legs forming a spring contact for confining the socket within a circuit board hole prior to soldering, locking dimples in opposite side walls of the socket body projecting into the connecting bight portion between said inner legs to confine the spring portion within the socket, and a solder resist on the bight portions joining said inner and outer legs to prevent solder from flowing into the interior of the socket during soldering of the socket to the circuit board.

20. A disconnect socket as in claim 19 wherein the connections between said bight portion and said exterior legs are located immediately adjacent the socket body.

21. A circuit board socket comprising a hollow socket body closed at one end and open at the other end, a U-shaped spring contact positioned on one wall of the socket body with one leg of the contact within the socket body to form a contact for an element inserted into the socket, the bight portion of the contact extending around the lip at the open end of the socket body and the other leg of the contact extending along the exterior of the socket to form a solder contact.

22. A circuit board socket as in claim 21 wherein each of said legs is bowed away from the socket body.

23. A circuit board socket as in claim 22 wherein the juncture between said bight portion and said other leg is immediately adjacent the exterior surface of the socket body.

24. A circuit board socket as in claim 22 wherein said bight portion is covered with a solder resist.

25. A circuit board socket as in claim 21 wherein the exterior surface of said socket body and said other leg define a solder flow path extending along the length of the socket body.

26. A circuit board socket comprising a hollow socket body closed at one end and open at the other end, a contact spring confined within the socket body for forming electrical connection with a lead inserted into the body, means on the outside of the socket body cooperating with the exterior surface of the body to define a solder flow path extending along the length of the body; and a connecting member extending around the lip at the open end of the body joining said contact spring and said means.

27. A circuit board socket as in claim 25 wherein said means includes a spring for confining the circuit board socket within a circuit board hole prior to soldering.

28. A circuit board socket as in claim 25 wherein said means comprises a leg extending along the length of the body, said leg including a spring portion for confining the socket within a circuit board hole prior to soldering.

* * * * *

UNITED STATES PATENT OFFICE
CERTIFICATE OF CORRECTION

Patent No. 3,681,738 Dated August 1, 1972.

Inventor(s) Lindsay C. Friend

It is certified that error appears in the above-identified patent and that said Letters Patent are hereby corrected as shown below:

Column 5, line 43, "body", first occurrence, should read -- bight -- .

Signed and sealed this 8th day of May 1973.

(SEAL)
Attest:

EDWARD M.FLETCHER,JR.
Attesting Officer

ROBERT GOTTSCHALK
Commissioner of Patents